(12) United States Patent
Gu et al.

(10) Patent No.: US 9,819,098 B2
(45) Date of Patent: Nov. 14, 2017

(54) ANTENNA-IN-PACKAGE STRUCTURES WITH BROADSIDE AND END-FIRE RADIATIONS

(71) Applicant: International Business Machines Corporation, Armonk, NY (US)

(72) Inventors: Xiaoxiong Gu, White Plains, NY (US); Alberto V. Garcia, Hartsdale, NY (US); Duixian Liu, Scarsdale, NY (US); Scott K. Reynolds, Amawalk, NY (US)

(73) Assignee: International Business Machines Corporation, Armonk, NY (US)

( * ) Notice: Subject to any disclaimer, the term of this patent is extended or adjusted under 35 U.S.C. 154(b) by 232 days.

(21) Appl. No.: 14/023,995

(22) Filed: Sep. 11, 2013

(65) Prior Publication Data
US 2015/0070228 A1  Mar. 12, 2015

(51) Int. Cl.
*H01Q 25/00* (2006.01)
*H01Q 1/22* (2006.01)
*H01Q 9/04* (2006.01)
*H01Q 9/26* (2006.01)
*H01Q 13/08* (2006.01)
*H01Q 19/30* (2006.01)

(52) U.S. Cl.
CPC ........... *H01Q 25/00* (2013.01); *H01Q 1/2283* (2013.01); *H01Q 9/0407* (2013.01); *H01Q 9/26* (2013.01); *H01Q 13/085* (2013.01); *H01Q 19/30* (2013.01)

(58) Field of Classification Search
CPC ..................................................... H01Q 25/00
USPC ......................................................... 343/727
See application file for complete search history.

(56) References Cited

U.S. PATENT DOCUMENTS

| | | | | |
|---|---|---|---|---|
| 5,165,109 A | * | 11/1992 | Han | H01Q 9/0457 343/700 MS |
| 5,684,491 A | * | 11/1997 | Newman | H01Q 3/24 342/372 |
| 6,518,931 B1 | * | 2/2003 | Sievenpiper | H01Q 13/085 343/767 |
| 7,385,555 B2 | | 6/2008 | Mahmoud et al. | |
| 7,423,606 B2 | | 9/2008 | Knadle, Jr. et al. | |
| 7,518,221 B2 | | 4/2009 | Gaucher et al. | |
| 7,545,329 B2 | * | 6/2009 | Gaucher | H01Q 9/26 343/700 MS |
| 7,841,076 B2 | | 11/2010 | Fujii | |

(Continued)

FOREIGN PATENT DOCUMENTS

JP  2012523802 A  10/2012
JP  2012523803 A  10/2012

OTHER PUBLICATIONS

S. Agarwal et al., "Concurrent 85 GHz/94GHz Slotted Gap Coupled Parasitic Microstrip Antenna for Millimeter Wave Applications," IEEE National Conference on Communications (NCC), Feb. 2013, 5 pages, New Delhi, India.

*Primary Examiner* — Dameon E Levi
*Assistant Examiner* — Walter Davis
(74) *Attorney, Agent, or Firm* — Vazken Alexanian; Ryan, Mason & Lewis, LLP

(57) ABSTRACT

Package structures are provided having antenna-in-packages that are integrated with semiconductor RFIC (radio frequency integrated circuit) chips to form compact integrated radio/wireless communications systems that operate in the millimeter wave (mmWave) frequency range with radiation in broadside and end-fire directions.

20 Claims, 9 Drawing Sheets

(56) References Cited

U.S. PATENT DOCUMENTS

| | | |
|---|---|---|
| 8,160,530 B2 | 4/2012 | Corman et al. |
| 2007/0063056 A1* | 3/2007 | Gaucher ............. H01L 23/4334 235/492 |
| 2007/0164907 A1* | 7/2007 | Gaucher ............. H01Q 1/2283 343/700 MS |
| 2008/0198082 A1 | 8/2008 | Soler Castany et al. |
| 2009/0015483 A1* | 1/2009 | Liu ..................... H01Q 9/0457 343/700 MS |
| 2010/0327068 A1* | 12/2010 | Chen ................ G06K 19/07749 235/492 |
| 2012/0149300 A1 | 6/2012 | Forster |
| 2012/0212384 A1 | 8/2012 | Kam et al. |
| 2013/0088391 A1 | 4/2013 | Corman et al. |

\* cited by examiner

200

300

400

500

600

800

900

ANTENNA-IN-PACKAGE STRUCTURES WITH BROADSIDE AND END-FIRE RADIATIONS

STATEMENT REGARDING FEDERALLY SPONSORED RESEARCH OR DEVELOPMENT

This invention was made with Government support under Contract No. FA8650-09-C-7924 (awarded by the Advanced Research Development Agency). The Government has certain rights in this invention.

TECHNICAL FIELD

The field generally relates to package structures with integrated antennas and, in particular, package structures having antenna-in-packages integrated with semiconductor RFIC (radio frequency integrated circuit) chips to form compact integrated radio/wireless communications systems that operate in the millimeter wave (mmWave) frequency range with radiation in broadside and end-fire directions.

BACKGROUND

There is an increasing demand for low-cost wireless communication systems that operate in the 60-GHz frequency band and which support gigabit-per-second (Gbps) data rates. Typical applications that demand Gbps data rates include, for example, wireless gigabit Ethernet and wireless uncompressed high-definition video applications. This technology allows users to wirelessly link portable devices such as electronic tablets and smartphones to computers, kiosks, high-definition displays and projectors, for example, with data rates that are thousands of times faster than standard Bluetooth or Wireless LAN protocols. Recent advances in CMOS and SiGe technologies have enabled single chip solutions, making the 60-GHz technology more commercially attractive. However, for the 60-GHz market to flourish, not only are low-cost device solutions required, but also low-cost RFIC packages with integrated antennas.

SUMMARY

In general, embodiments of the invention include structures and methods for integrally packaging antenna structures with semiconductor RFIC chips to form compact integrated radio/wireless communications systems that operate in the millimeter wave frequency range with radiation in broadside and end-fire directions.

In one embodiment of the invention, a package structure includes an antenna package and an RFIC (radio frequency integrated circuit) chip mounted to the antenna package. The antenna package includes a first antenna, a first antenna feed line, a second antenna, and a second antenna feed line. The first antenna is connected to the RFIC chip by the first antenna feed line and the second antenna is connected to the RFIC chip by the second antenna feed line. The first antenna provides broadside radiation and the second antenna provides end-fire radiation.

In another embodiment of the invention, an antenna package includes a first substrate, a second substrate bonded to the first substrate, and an antenna ground plane disposed between the first and second substrates. The first substrate includes a first antenna and the second substrate includes a second antenna. The first antenna is configured to provide broadside radiation and the second antenna is configured to provide end-fire radiation.

In another embodiment of the invention, a wireless communications device includes an antenna package, an RFIC (radio frequency integrated circuit) chip mounted to the antenna package, and an application board. The antenna package includes a first antenna, a first antenna feed line, a second antenna, and a second antenna feed line. The first antenna is connected to the RFIC chip by the first antenna feed line and the second antenna is connected to the RFIC chip by the second antenna feed line. The first antenna provides broadside radiation and the second antenna provides end-fire radiation. The antenna package is mounted to the application board such that a portion of the antenna package having the second antenna is disposed at a distance past an edge of the application board.

These and other embodiments of invention will be described or become apparent from the following detailed description of embodiments, which is to be read in conjunction with the accompanying drawings.

DETAILED DESCRIPTION

Embodiments of the invention will now be discussed in further detail with regard to structures and methods for integrally packaging antenna structures with semiconductor RFIC chips to form, compact integrated radio/wireless communications systems that operate in the millimeter wave frequency range with radiation in broadside and end-fire directions. It is to be understood that the various layers, structures, and regions shown in the accompanying drawings are not drawn to scale, and that one or more layers, structures, and regions of a type commonly used in integrated antenna and chip packages may not be explicitly shown in a given drawing. This does not imply that the layers, structures and regions not explicitly shown are omitted from the actual integrated chip packages. Moreover, the same or similar reference numbers used throughout the drawings are used to denote the same or similar features, elements, or structures, and thus, a detailed explanation of the same or similar features, elements, or structures will not be repeated for each of the drawings.

Figure 1:
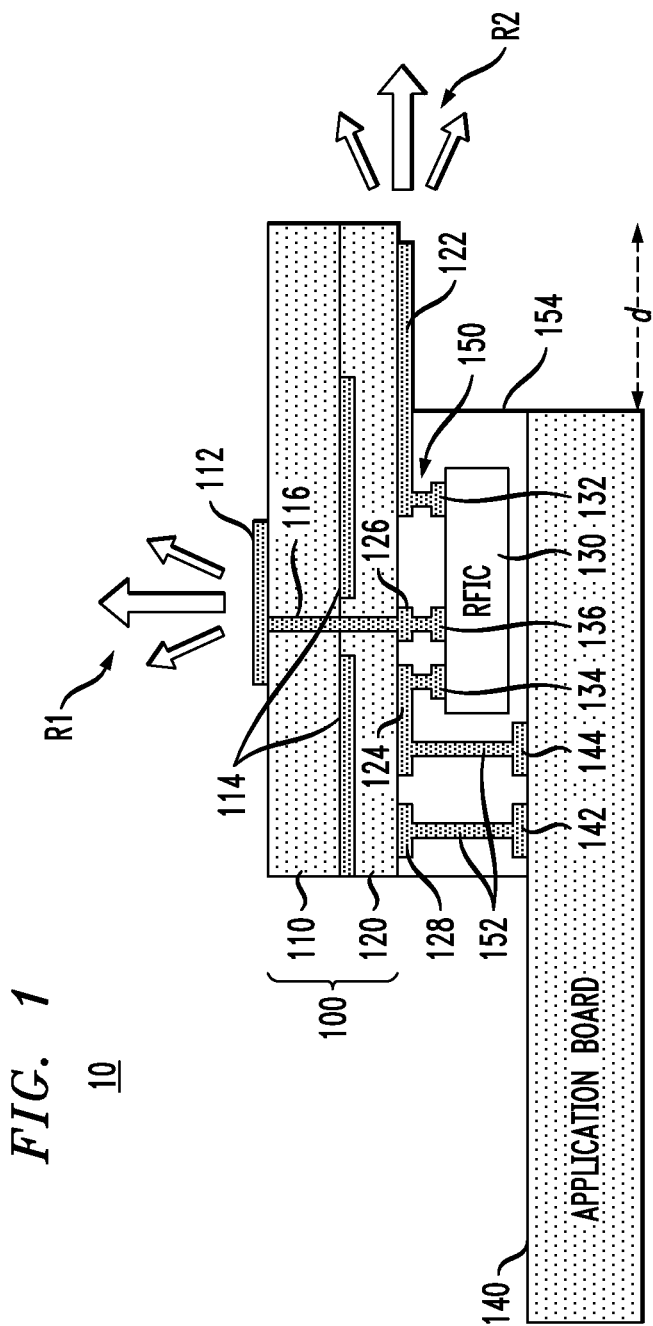
FIG. 1 schematically depicts a wireless communications package structure according to an embodiment of the invention.

FIG. 1 schematically depicts a wireless communications package 10 according to an embodiment of the invention. In general, the wireless communications package 10 comprises an antenna-in-package 100 (or "antenna package"), an RFIC chip 130, and an application board 140. The antenna package 100 comprises a first substrate 110 and a second substrate 120. The first substrate 110 comprises a first antenna 112 and an antenna ground plane 114, which are formed on opposing sides of the first substrate 110. The second substrate 120 comprises a second antenna 122 and other metallization patterns 124, 126 and 128 formed on a surface thereof, which include contact pads 126, electrical wiring, etc. An antenna feed line 116 is formed through the first and second substrates 110 and 120 in electrical contact with the first antenna 112 and the metallization pattern 126.

In one embodiment of the invention, the substrates 110 and 120 are formed of standard FR4 material with copper metallization, or other suitable materials commonly used to construct a standard PCB (printed circuit board), or other substrate materials that may be otherwise selected to achieve a desired or optimal performance. The substrates 110 and 120 can be formed with other materials having mechanical and electrical properties that are similar to FR4 providing a relatively rigid structure to support the antenna package 100 structure. Depending on the application frequency and other factors related to the type of planar antenna structures used, the substrates 110 and 120 can each have a thickness in a range of about 4 mils to about 20 mils.

The RFIC chip 130 comprises a plurality of metallization patterns 132, 134 and 136 formed on an active side thereof, which include contact pads, electrical wiring, etc. The RFIC chip 130 comprises RFIC circuitry and electronic components formed on the active side including, for example, a receiver, a transmitter or a transceiver circuit, and other active or passive circuit elements that are commonly used to implement wireless RFIC chips. The metallization patterns 132, 134 and 136 of the RFIC chip 130 include, for example, ground pads, DC power supply pads, input/output pads, control signal pads, etc., which are formed as part of a BEOL (back end of line) wiring structure that is connected to integrated circuit components of the RFIC chip 130, as is readily understood by those of ordinary skill in the art. The RFIC chip 130 is flip-chip mounted to the second substrate 120 of the antenna package 100 using controlled collapse chip connections (C4) 150, or other known techniques.

Moreover, the application board 140 comprises a plurality of metallization patterns 142 and 144 formed on a surface thereof, which include contact pads, wiring, etc. The antenna package 100 is connected to the application board 140 using ball grid array (BGA) connections 152, or other known techniques. An under fill material 154 is used to strengthen the C4 connections 150 and BGA connections 152.

In the embodiment of FIG. 1, the second substrate 120 serves as an interface between the RFIC chip 130 and the application board 140 via the C4connections 150 and BGA connections 152. In particular, some BGA connections 152 may be non-electrical connections that merely serve to bond the antenna package 100 to the application board 140. Similarly, some C4 connections 150 may be non-electrical connections that merely serve to bond the RFIC chip 130 to the antenna package 100. For example, the BGA connection 152 between the metallization patterns 128 and 142 can serve as a non-electrical, bonding connection.

Other BGA connections 152 and C4connections 150 serve as bonding connections, as well as electrical connections between the application board 140 and the RFIC chip 130. For instance, in the embodiment of FIG. 1, the C4connection 150 and BGA connection 152 between the metallization patterns 134, 144, and 124 can form a power interconnect to supply DC power from the application board 140 to the RFIC chip 130, or otherwise provide an I/O interconnect to transmit I/O or control signals between the RFIC chip 130 and the application board 140, etc. Moreover, some C4connections 150 serve as bonding connections, as well as electrical connections between the RFIC chip 130 and the antenna package 100. For instance, in the embodiment of FIG. 1, the C4connection 150 between the metallization patterns 126 and 136 electrically connect an integrated circuit of the RFIC chip 130 with the antenna feed line 116, and can form a part of the antenna feed line. Moreover, the C4connection 150 between the metallization pattern 132 and the second antenna 122 metallization can form part of an antenna feed line that feeds the second antenna 122.

In the embodiment of FIG. 1, the wireless communications package 10 provides broadside radiation R1 via the first antenna 112 (wherein the primary radiation beam is perpendicular to the application board 140), as well as end-fire radiation R2 via the second antenna 122 (wherein the primary radiation beam is parallel to the application board 140). As shown in FIG. 1, the antenna package 100 is mounted to the application board 140 so that an edge region of the antenna package 100 extends at some distance, d, past an edge of the application board 140. This mounting technique allows the second antenna 122 on the bottom of the second substrate 120 to be disposed away from other structures and components of the wireless communications package 10, which prevents the radiation properties of the second antenna 122 from being adversely affected by the other structures and components of the wireless communications package 10.

The wireless communications package 10 can support 60 GHz antenna-in-package solutions, for example, for either single antenna or phased-array applications for portable application such as electronic tablets and smart phones. Indeed, for portable applications, the combination of broadside and end-fire radiation improves wireless performance and reduces specific absorption rate (SAR), an important health concern, especially with switchable antenna beams. While the antenna package 100 is shown as being formed with two separate substrates 110 and 120, an antenna package can be formed with one substrate. However, a single substrate design can make the antenna package 100 larger in size, which may not be suitable for portable applications where small size is desired.

Although the first and second antennas 112 and 122 are depicted generically in FIG. 1, the first and second antennas 112 and 122 can be implemented using known antenna structures. For example, for broadside radiation, the first antenna 112 can be a planar patch antenna or a cavity antenna. For end-fire radiation, the second antenna 122 can be a Yagi antenna, a tapered-slot antenna, a dipole antenna, a folded dipole antenna, or a Vivaldi antenna, for example. Various antenna package structures with antennas providing broadside and end-fire radiation will now be discussed in further detail with reference to FIGS. 2A/2B, 3A/3B, 4, 5, 6A/6B. 7A/7B, 8A/8B, and 9.

Figure 2A:
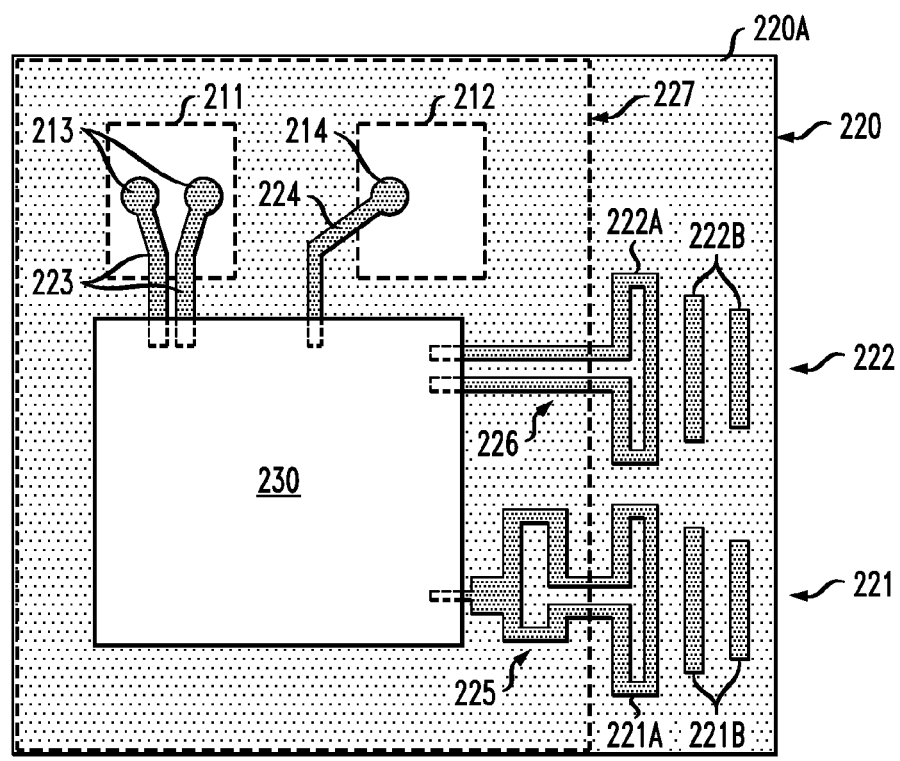
FIGS. 2A and 2B schematically depict an antenna package according to an embodiment of the invention.
Figure 2B:
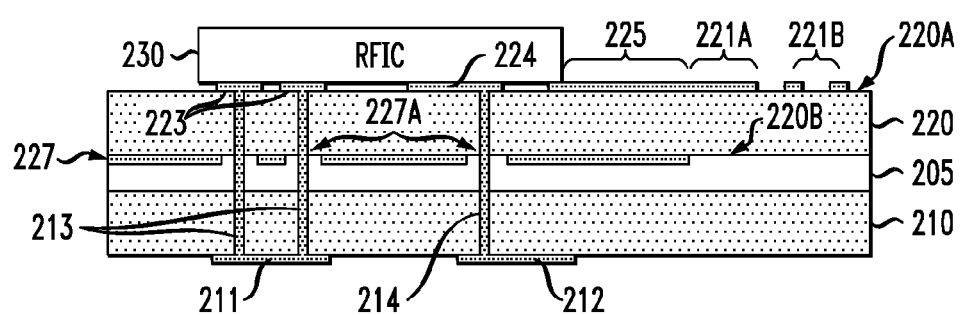

For example, FIGS. 2A and 2B schematically depict an antenna package 200 according to an embodiment of the invention, wherein FIG. 2A is a schematic top view of the antenna package 200, and FIG. 2B is a schematic side view of the antenna package 200. In general, the antenna package 200 comprises a first substrate 210, a second substrate 220, and an RFIC chip 230 that is flip-chip mounted to a first surface 220A of the second substrate 220. The first substrate 210 and second substrate 220 are bonded together using an adhesive layer 205 (or prepreg). The first substrate 210 comprises a first patch antenna 211 and a second patch antenna 212 formed on a surface thereof. The second substrate 220 comprises a first Yagi-Uda array (Yagi) antenna 221 and a second Yagi antenna 222 formed on the first surface 220A thereof. The first and second Yagi antennas 221 and 222 each comprise a respective driven element 221A and 222A (e.g., folded dipole element) and respective parasitic elements 221B and 222B (e.g. director elements). The ground plane 227 serves as a reflector element for the first and second Yagi antennas 221 and 222. In the embodiment of FIGS. 2A/2B, the first and second patch antennas 211 and 212 are used for broadside radiation, while the first and second Yagi antennas 221 and 222 are used for end-fire radiation.

The antenna package 200 further comprises a plurality of feed lines that connect the RFIC chip 230 to the antennas 211, 212, 221, and 222. In particular, a first antenna feed line 213/223 feeds the first patch antenna 211, a second antenna feed line 214/224 feeds the second patch antenna 212, a third antenna feed line 225 feeds the first Yagi antenna 221, and a fourth antenna feed line 226 feeds the second Yagi antenna 222. A ground plane 227 is formed on second surface of the second substrate 220 opposite the first on which the first and second Yagi antennas 221 and 222 are formed. In many 60 GHz applications, for example, transmitting antennas use differential feed lines, while receiving antennas use single-ended feed lines.

In this regard, in one embodiment of the invention, the first patch antenna 211 operates as a transmitting antenna in the broadside direction, which is fed by a differential antenna feed line, while the second patch antenna 212 operates as a receiving antenna in the broadside direction, which is fed by a single-ended antenna feed line. In particular, the first antenna feed line 213/223 comprises a differential vertical probe portion 213, and a planar differential line portion 223. The differential vertical probe portion 213 is connected to the first patch antenna 211 and extends through the first and second substrates 210 and 220. The planar different line portion 223 is formed on the surface 220A of the second substrate 220 and is connected to the RFIC chip 230.

The second antenna feed line 214/224 comprises a single vertical probe portion 214, and a single planar line portion 224. The single vertical probe portion 214 is connected to the second patch antenna 212 and extends through the first and second substrates 210 and 220. The single planar line portion 224 is formed on the surface 220A of the second substrate 220 and is connected to the RFIC chip 230. In other embodiments of the invention, a single-ended patch antenna (with a single-ended feed point) can be differentially fed by using a BALUN to transform the single-ended feed point to a differential feed, and thereby provide a differentially fed patch antenna having only one feed point attached to the patch antenna.

Furthermore, in one embodiment of the invention, the first Yagi antenna 221 operates as a receiving antenna in the end-fire direction, which is feed by a single-ended antenna feed line, while the second Yagi antenna 222 operates as a transmitting antenna in the end-fire direction, which is feed by a differential antenna feed line. In particular, the third antenna feed line 225 is a BALUN that is formed on the first surface 220A of the second substrate 200 connecting the first Yagi antenna 221 to the RFIC chip 230, wherein the BALUN transforms the natural differential input of the first Yagi antenna 221 to a single-ended feed. Moreover, the fourth antenna feed line 226 is a planar balanced differential feed line that is formed on the surface 220A of the second substrate 220 connecting the second Yagi antenna 222 to the RFIC chip 230.

In one embodiment of the invention, the differential vertical probe portion 213 and the single vertical probe portion 214 of the antenna feed lines are metallized via holes that are formed in the first and second substrates 210 and 220 in vertical alignment with each other. The ground plane 227 formed on the second surface 220B of the second substrate 220 comprises a plurality of etched openings 227A through which the vertical probe portions 213 and 214 can pass and remain electrically isolated from the ground plane 227. The ground plane 227 operates as an antenna ground plane for the first and second patch antennas 211 and 212, and serves as a ground plane for the planar antenna feed lines 223, 224, 225 and 225 that are formed on the first surface 220A of the second substrate 220, and further serves as the reflector element of the first and second Yagi antennas 221 and 222. The ground plane 227 is formed on the entire area of the second surface 220B of the second substrate 220 except for the area under the first and second Yagi antennas 221 and 222.

As in the generic embodiment shown in FIG. 1, the antenna package 200 of FIGS. 2A/2B can be mounted to an application board using BGA connections between the first surface 220A of the second substrate 220 and the application board, with the portion of the antenna package 200 having the first and second Yagi antennas 221 and 222 extending past an edge of the application board. In such instance, as noted above, the first and second patch antennas 211 and 212 facing away from the application board would be used for broadside radiation, while the first and second Yagi antennas n1 and 222 (disposed past the edge of the application board) would be used for end-fire radiation.

Further, in one embodiment of the invention, the first patch antenna 211 and second Yagi antenna 222 (transmitting antennas) can be independently operated to transmit radiation in only one of the broadside or end-fire directions, or in both directions at the same time. Moreover, the first patch antenna 211 and second Yagi antenna 222 can be operated as a two-element phased array antenna to steer the transmitting radiation beam in a given direction between the broadside and end-fire directions, using beam steering techniques well-known to those of ordinary skill in the art.

In another embodiment of the invention, the broadside patch antennas 211 and 212, for example, can both be transmitting antennas that are configured as a mini phased array antenna with beam steering control. In yet another embodiment, one or more additional patch antennas can be formed on the first substrate 210 (in addition to the first and second patch antennas 211 and 212), where the additional patch antenna operates as a receiving antenna, while the broadside transmitting patch antennas 211 and 212 are configured as a phased array antenna. In another embodiment of the invention, the broadside patch antennas 211 and 212 can be connected to a transceiver circuit and alternatively operated as transmitting and receiving antennas using a transceiver switch with a time-division multiplexing (TDM) scheme, as is understood by those of ordinary skill in the art.

Figure 3A:
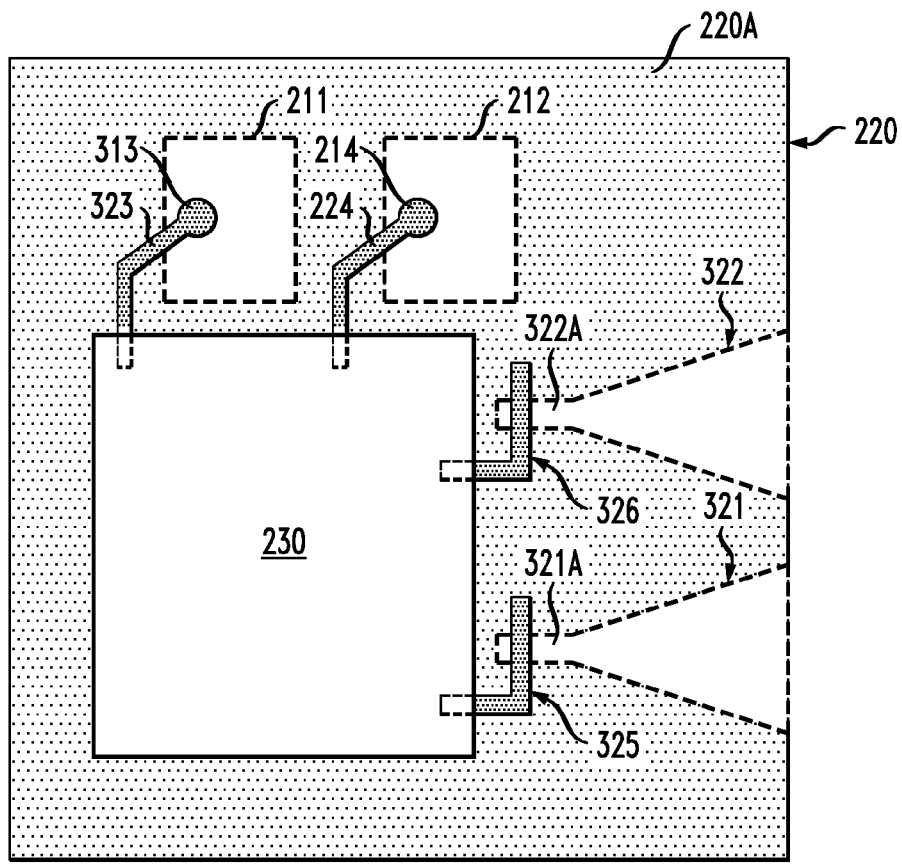
FIGS. 3A and 3B schematically depict an antenna package according to another embodiment of the invention.
Figure 3B:
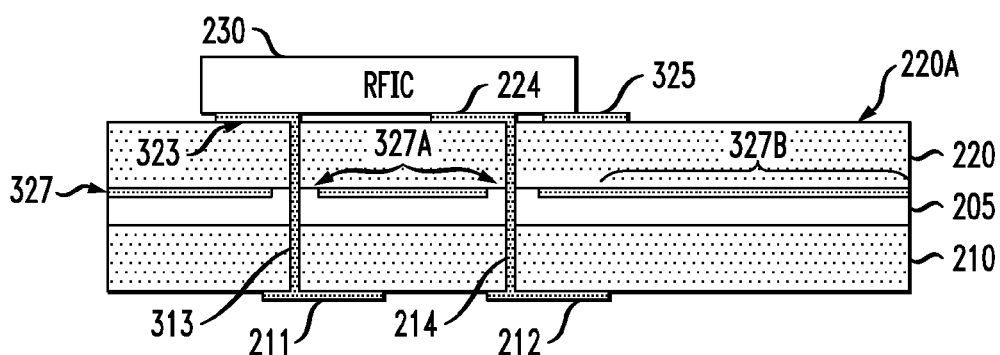

FIGS. 3A and 3B schematically depict an antenna package 300 according to an embodiment of the invention, wherein FIG. 3A is a schematic top view of the antenna package 300, and FIG. 3B is a schematic side view of the antenna package 300. The antenna package 300 is similar to the antenna package 200 discussed above with reference to FIGS. 2A and 2B, except that the first patch antenna 211 is fed with a single-ended antenna feed line 313/323 which comprises a single vertical probe portion 313, and a single planar line portion 323. The single vertical probe portion 313 is connected to the first patch antenna 211 and extends through the first and second substrates 210 and 220. The single planar line portion 323 is formed on the surface 220A of the second substrate 220 and is connected to the RFIC chip 230.

Furthermore, the antenna package 300 comprises a ground plane 327 having etched portions 327A to electrically isolate the vertical probe portions 214 and 313 of the antenna feed lines from the ground plane 327. Further, the ground plane 327 comprises an area 327B that is patterned/etched to form a first tapered-slot antenna 321 and a second tapered-slot antenna 322, with single ended feeds. In particular, first and second L-shaped feed lines 325 and 326 are formed on the first surface 220A of the second substrate 220. The first L-shaped feed line 325 couples electromagnetic energy to and from an input slot portion 321A of the first tapered-slot antenna 321, and the second L-shaped feed line 326 couples electromagnetic energy to and from an input slot portion 322A of the second tapered-slot antenna 322. The first and second tapered-slot antennas 321 and 322 are used for end-fire radiation. In other embodiments of the invention, the first L-shaped feed line 325 and/or the second L-shaped feed line 326 can be connected to a BALUN as needed, if the first tapered-slot antenna 321 and/or the second tapered-slot antenna 322 are connected to a differential-feed transceiver in the RFIC chip 230.

Figure 4:
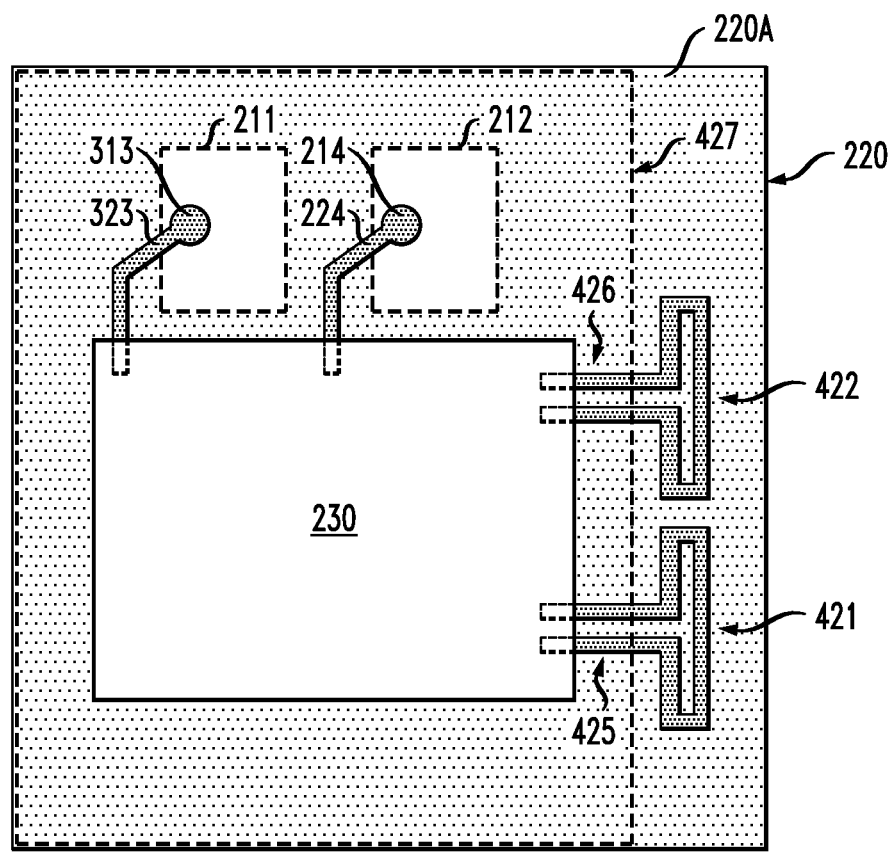
FIG. 4 schematically depicts an antenna package according to another embodiment of the invention.

FIG. 4 schematically depicts an antenna package 400 according to another embodiment of the invention. The antenna package 400 shown in FIG. 4 is similar to the antenna package 300 discussed above with reference to FIGS. 3A and 3B, except that the antenna package 400 comprises a first folded dipole antenna 421 and a second folded dipole antenna 422 to provide end-fire radiation. Moreover, a first differential feed line 425 is formed on the surface 220A of the second substrate 220 to feed the first folded dipole antenna 421, and a second differential feed line 426 is formed on the surface 220A of the second substrate 220 to feed the second folded dipole antenna 422. Furthermore, a ground plane 427 (shown in dashed outline form) on the opposing surface of the second substrate 220 does not extend under the first and second folded dipole antennas 421 and 422.

In another embodiment of the invention, the first and second folded dipole antennas 421 and 422 can be replaced with regular dipole antennas. However, a folded dipole antenna provides wider bandwidth and better impedance matching than regular dipole antenna. Indeed, since a differential feed line with high impedance is typically used to feed a dipole or a folded dipole antenna, it is not possible to match the impedance of a dipole antenna to the impedance of the differential feed line without using other impedance matching circuit structures.

Figure 5:
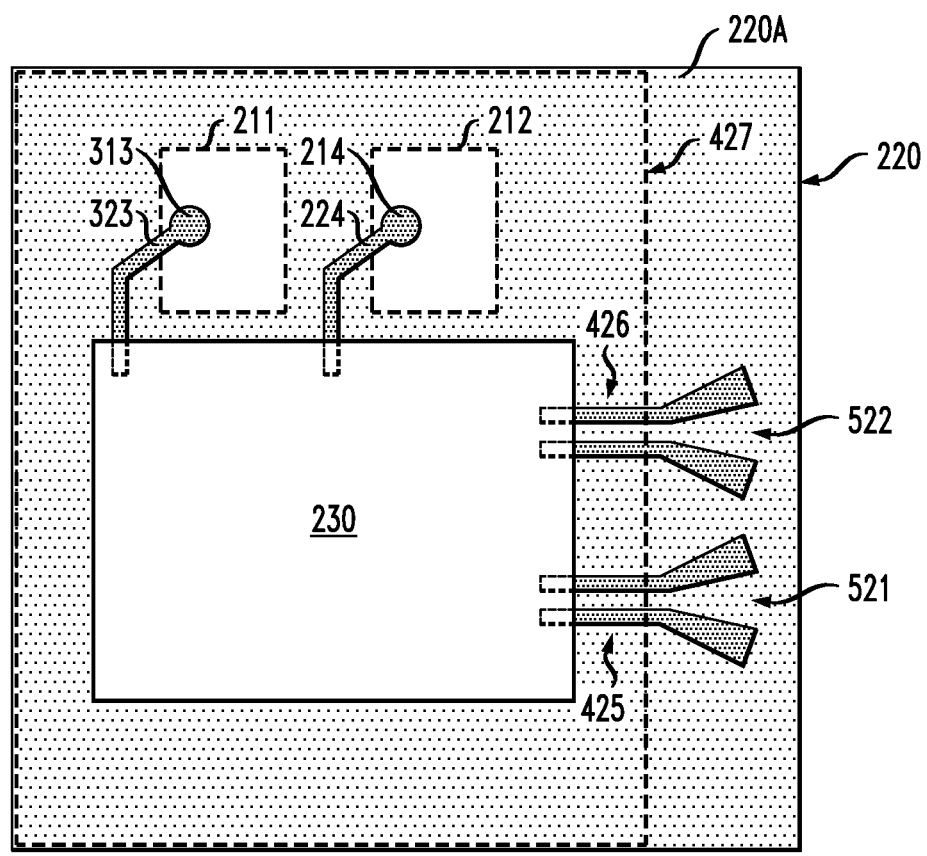
FIG. 5 schematically depicts an antenna package according to another embodiment of the invention.

FIG. 5 schematically depicts an antenna package 500 according to another embodiment of the invention. The antenna package 500 shown in FIG. 5 is similar to the antenna package 400 discussed above with reference to FIG. 4, except that the antenna package 500 comprises a first Vivaldi antenna 521 and a second Vivaldi antenna 522 to provide end-fire radiation. The planar Vivaldi antenna structure provides very wide bandwidth, which is desired for certain applications.

Figure 6A:
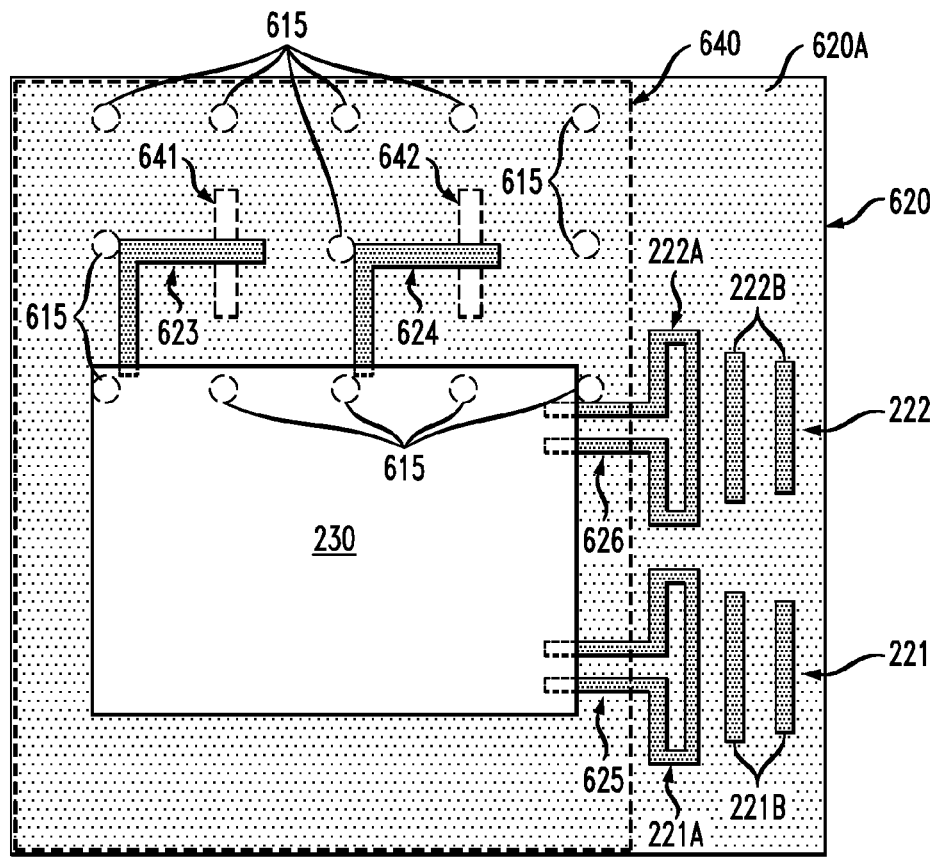
FIGS. 6A and 6B schematically depict an antenna package according to another embodiment of the invention.
Figure 6B:
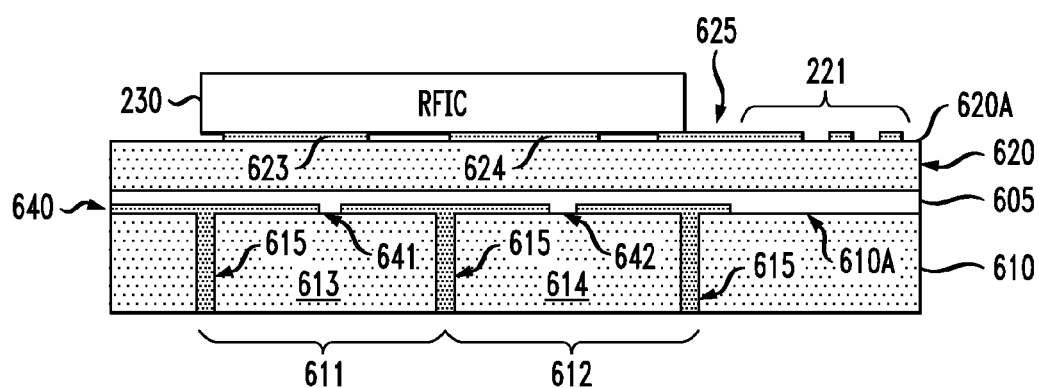

FIGS. 6A and 6B schematically depict an antenna package 600 according to another embodiment of the invention, wherein FIG. 6A is a schematic top view of the antenna package 600, and FIG. 6B is a schematic side view of the antenna package 600. In general, similar to previously discussed embodiments, the antenna package 600 comprises a first substrate 610, a second substrate 620, and an RFIC chip 230 that is flip-chip mounted to a first surface 620A of the second substrate 620. The first substrate 610 and second substrate 620 are bonded together using an adhesive layer 605.

Moreover, similar to the embodiment discussed above in FIGS. 2A/2B, the second substrate 620 comprises a first Yagi antenna 221 and a second Yagi antenna 222 formed on the first surface 620A thereof, each comprising a respective driven element 221A and 222A (e.g., folded dipole element) and respective parasitic elements 221B and 222B (e.g. director elements). A ground plane 640 serves as a reflector element for the first and second Yagi antennas 221 and 222. The ground plane 640 is formed on a surface 610A of the first substrate 610, which is bonded to the second substrate 620. The perimeter of the ground plane 640 is depicted in FIG. 6A as a dashed line. The first and second Yagi antennas 221 and 222 are fed by first and second differential feed lines 625 and 626 formed on the first surface 620A of the second substrate 620. As in previously discussed embodiments, the first and second Yagi antennas 221 and 222 are used for end-fire radiation.

The first substrate 610 comprises a first aperture-coupled cavity antenna 611 and a second aperture-coupled cavity antenna 612 formed within the first substrate 610, which are used for broadside radiation. The first and second aperture-coupled cavity antennas 611 and 612 are formed by respective portions of dielectric material 613 and 614 of the first substrate 610 surrounded by metallic sidewalls and bottom walls of the antennas 611 and 612. In particular, the metallic sidewalls of the first and second aperture-coupled cavity antennas 611 and 612 are defined by a series of metalized via holes 615 which form rectangular via cages (as specifically shown in FIG. 6A) surrounding the respective portions of dielectric material 613 and 614. The metallic bottom walls of the first and second aperture-coupled cavity antennas 611 and 612 are defined by portions of the ground plane 640 within the perimeter of the respective via cages. The metalized via holes 615 that define the antenna sidewalls are spaced apart (pitch) at a distance that is less than one quarter wavelength of the desired operating frequency.

The ground plane 640 comprises a first aperture 641 and a second aperture 642, which serve as coupling slots to couple electromagnetic energy to and from the respective first and second aperture-coupled cavity antennas 611 and 612 from respective first and second antenna feed lines 623 and 624. The first and second antenna feed lines 623 and 624 transmit RF energy between the RFIC chip 230 and the first and second aperture-coupled cavity antennas 611 and 612. In one embodiment, the first and second antenna feed lines 623 and 624 are L-shaped strip lines that utilize the ground plane 640 as the transmission line ground plane.

The first and second aperture-coupled cavity antennas 611 and 612 are also referred to as "filled-cavity" antennas. In general, the resonant frequencies of the first and second aperture-coupled cavity antennas 611 and 612 is a function of the length, width and depth of the antennas structures (as defined by the metalized via holes 615 and ground plane 640), as well as the dielectric constant of the portions of the dielectric material 613 and 614 forming the antennas 611 and 612. In typical designs, cavity antennas have a wider bandwidth than patch antennas. In other embodiment, the broadside antenna radiators may be aperture-coupled patch antennas that replace the first and second aperture-coupled cavity antennas 611 and 612 in the antenna package 600.

Figure 7A:
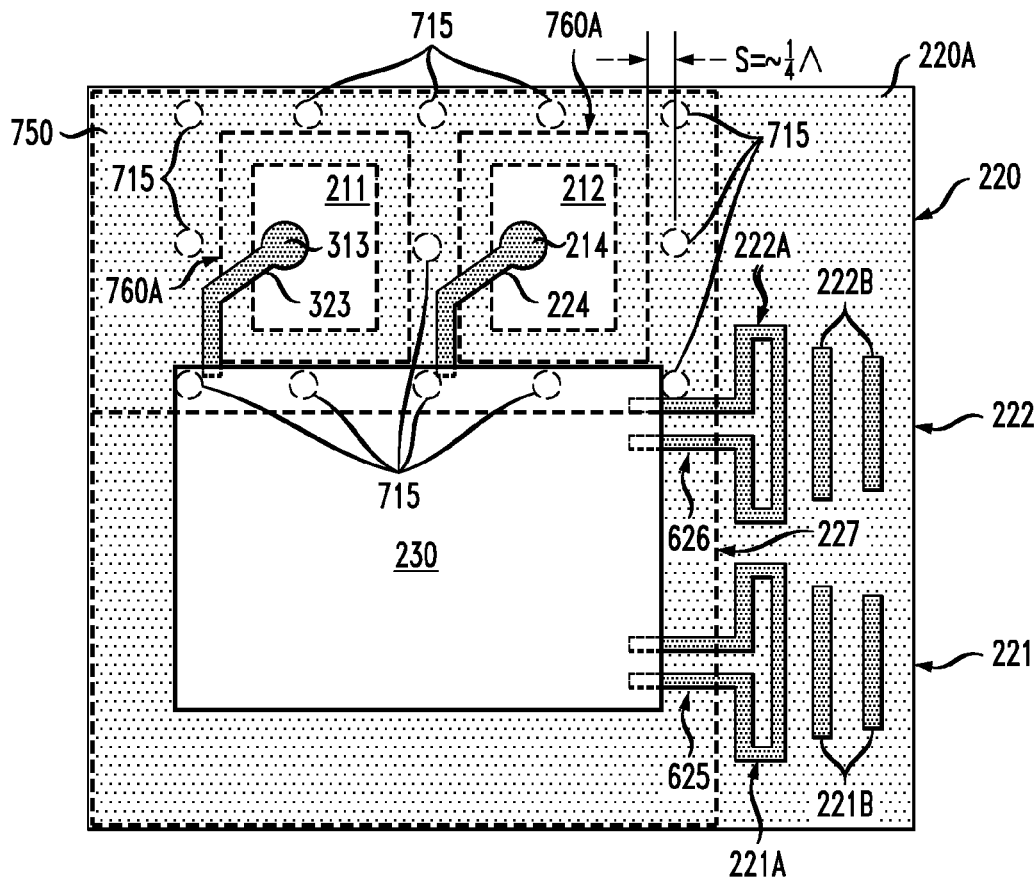
FIGS. 7A and 7B schematically depict an antenna package according to another embodiment of the invention.
Figure 7B:
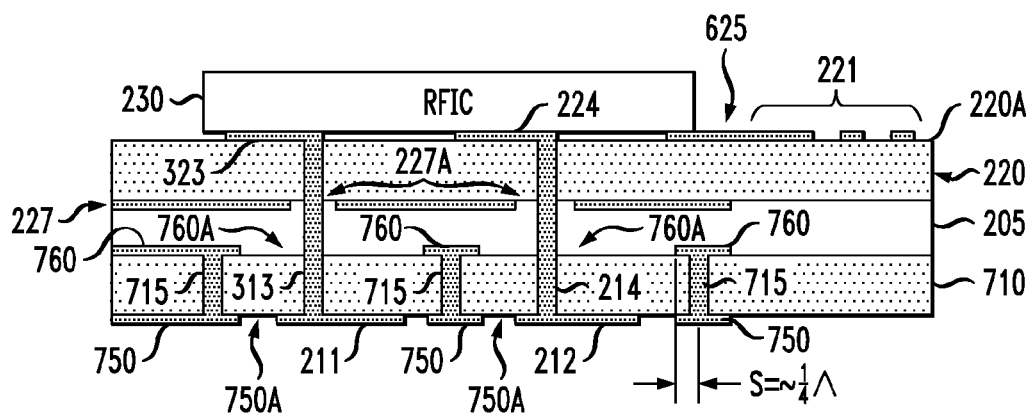

FIGS. 7A and 7B schematically depict an antenna package 700 according to another embodiment of the invention, wherein FIG. 7A is a schematic top view of the antenna package 700, and FIG. 7B is a schematic side view of the antenna package 700. In general, the antenna package 700 shown in FIGS. 7A and 7B has the same or similar components as shown in the antenna packages 200, 300 and 600 as discussed above, so a detailed discussion thereof will not be repeated. The antenna package 700 differs from the above embodiments in that the antenna package 700 comprises a first substrate 710 having metalized via holes 715, a patterned metallic top plane 750, and a patterned metallic backplane 760. The patterned metallic top plane 750 comprises etched regions 750A that electrically isolate the first and second patch antennas 211 and 212 from the metallic top plane 750. Moreover, the patterned metallic backplane 760 comprises etched regions 760A that are aligned with the first and second patch antennas 211 and 212 to expose the antenna ground plane 227.

The antenna package 700 is designed to suppress or eliminate the creation of surface waves, which is a common problem for patch antennas, especially in package structures. Surface waves not only reduce antenna efficiency and adversely affect antenna performance, but also cause antenna-in-package reliability issues, such as reduced performance depending on the location on an application board. In this regard, the metalized via holes 715, the metallic top plane 750, and the metallic backplane 760 from isolating cavities for the first and second patch antennas 211 and 212. In particular, as more specifically shown in FIG. 7A, the metalized via holes 715 essentially provide metallic cavity walls that form rectangular via cages which surround the first and second patch antennas 211 and 212. The metalized via holes 715 electrically connect the metallic top and back planes 750 and 760, thereby forming cavities that suppress or eliminate surface waves. For effective surface wave suppression, the spacing S (as shown in FIGS. 7A and 7B) between the metalized via holes 715 and the edges of the etched regions 750A and 760A of the metallic top and back planes 750 and 760 should be approximately ¼ wavelength of the operating frequency. In this embodiment, the metallic backplane 760 and the ground plane 227 are not physically connected in DC, but they are virtually connected at 60 GHz frequencies due to a large capacitance between the two planes 760 and 227.

Figure 8A:
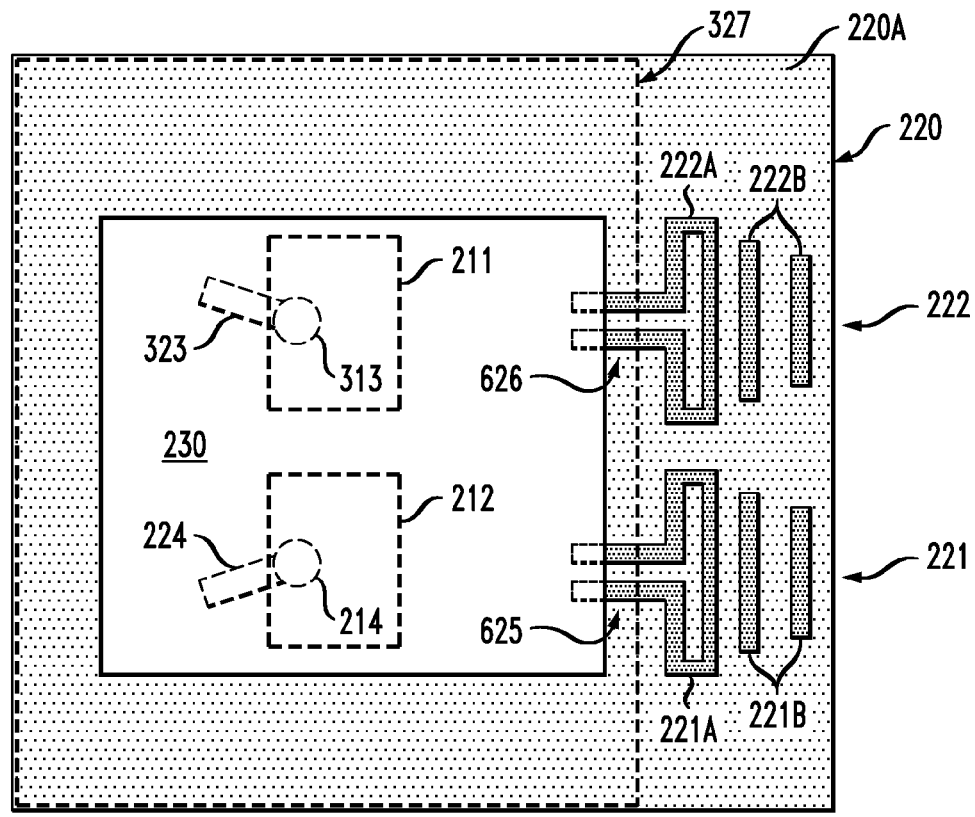
FIGS. 8A and 8B schematically depict an antenna package according to another embodiment of the invention.
Figure 8B:
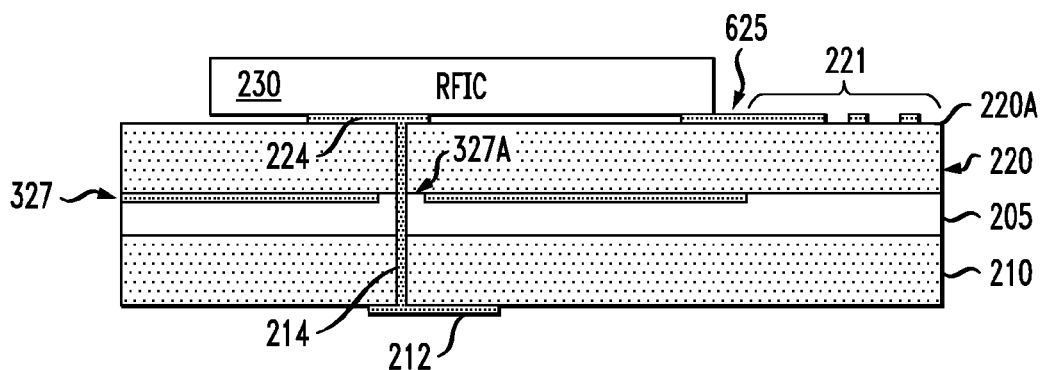

FIGS. 8A and 8B schematically depict an antenna package 800 according to another embodiment of the invention, wherein FIG. 8A is a schematic top view of the antenna package 800, and FIG. 8B is a schematic side view of the antenna package 800. In general, the antenna package 800 shown in FIGS. 8A and 8B has the same or similar components as shown in the antenna package embodiments as discussed above, so a detailed discussion thereof will not be repeated. The antenna package 800 differs from the above embodiments in that the first and second patch antennas 211 and 212 (broadside radiating antennas) are vertically disposed below RFIC chip 230, as compared to the antenna package 200, 300, 400, and 500, for example, wherein the first and second patch antennas 211 and 212 are vertically disposed away (i.e., offset) from edge of the RFIC chip 230. In this regard, the antenna package 800 can provide a more compact structure.

Figure 9:
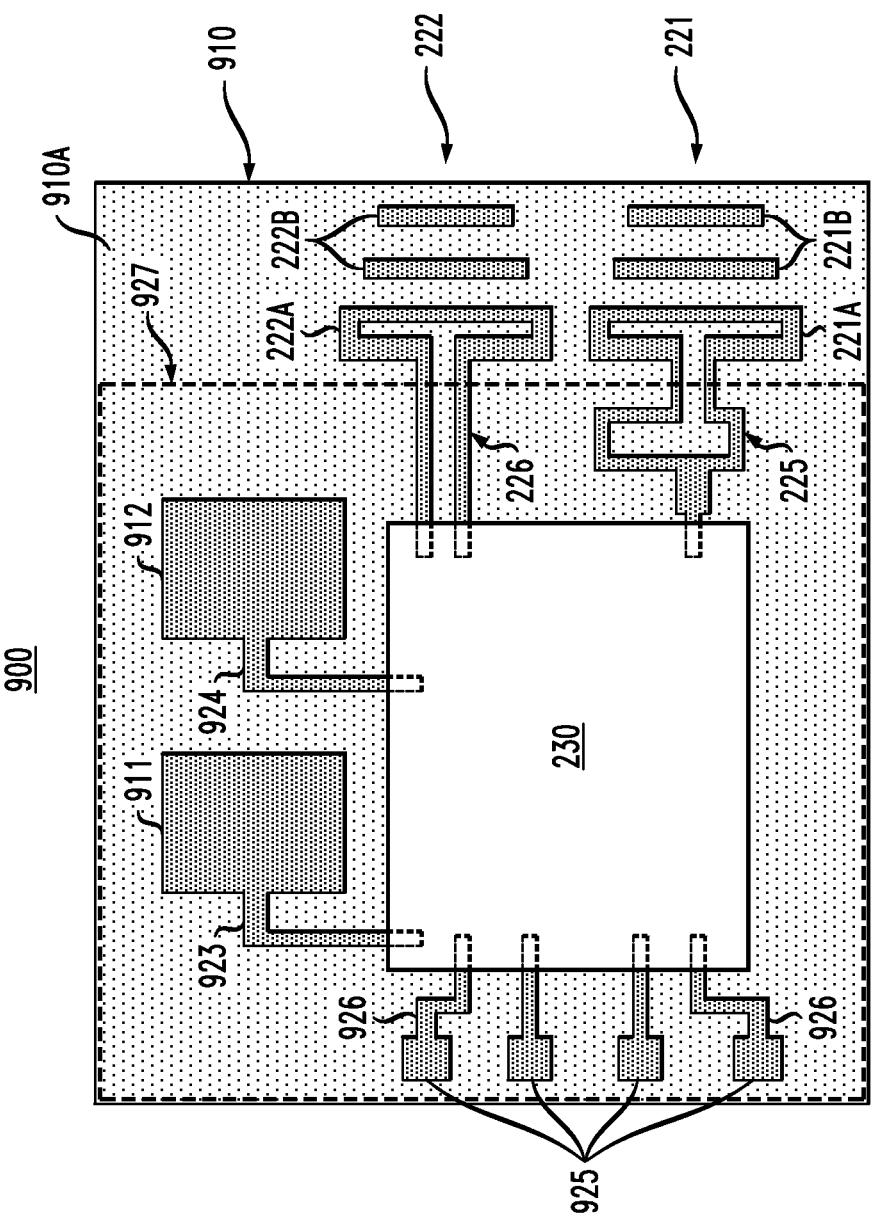
FIG. 9 schematically depicts an antenna package according to another embodiment of the invention.

FIG. 9 schematically depicts an antenna package 900 according to another embodiment of the invention. In particular, FIG. 9 is a schematic top view of an antenna package 900 comprising a single substrate 910 having various planar components patterned on a first surface 910A thereof, and a ground plane 927 formed on an opposing surface thereof (wherein the perimeter of the ground plane 927 is depicted as a dashed outline). Similar to the antenna package 200 shown in FIGS. 2A/2B, the antenna package 900 includes first and second Yagi antennas 221 and 222 and associated antenna feed lines 225 and 225, to provide end-fire radiation.

In addition, to provide broadside radiation, the antenna package 900 comprises first and second edge-fed patch antennas 911 and 912, and associated antenna feed lines 923 and 924, formed on the first surface 910A of the single substrate 910. In addition, the antenna package 900 comprises a plurality of BGA pads 925 and associated feed connections 926 to connect to the RFIC chip 230'. In this embodiment, the antenna package 900 would be mounted to an application board via BGA connections to the BGA pads 925, with the portion of the first surface 910A having the antennas. 911, 912, 221 and 22 extended past edges of the application board. If the requirement of the antenna package size is not critical or no more than four antennas are required, the single substrate antenna package 900 design of FIG. 9 can be used.

Those of ordinary skill in the art will readily appreciate the various advantages associated with integrated chip/antenna package structures according to embodiments of the invention. For instance, an antenna package structure can be readily fabricated using known PCB manufacturing and packaging techniques to fabricate and package antenna structures with semiconductor RFIC chips to form compact integrated radio/wireless communications systems for millimeter wave applications with radiations in the broadside and end-fire directions. Moreover, integrated chip packages according to embodiments of the invention enable antennas to be integrally packaged with IC chips such as transceiver chips, which provide compact designs with very low loss between the transceiver and the antenna.

Moreover, various types of antenna designs can be implemented as discussed above to provide broadside and end-fire radiation. Although embodiment of antenna packages discussed herein depict one or two substrates, antenna packages can be constructed with three or more substrates, depending on the intended application. Moreover, although the embodiments discussed herein show the use of two antennas for broadside and end-fire radiations, additional antennas can be included to achieve increased antenna gain or to implement phased array antenna structures.

It is to be further understood that the antenna package structures illustrated herein can extended or varied depending on the application, e.g., antenna structure, I/O routing requirements, power and ground plane requirements, etc. Those of ordinary skill in the art readily understand that the antenna performance parameters such as antenna radiation efficiency and bandwidth and operating resonant frequency will vary depending on the dielectric constant, loss tangent, and thickness of the dielectric/insulating materials that form the substrate layers. Moreover, the size and structure of the various radiating elements of the antennas shown in drawings will determine the resonant frequency of the antenna, as is well understood to those of ordinary skill in the art.

Although embodiments have been described herein with reference to the accompanying drawings for purposes of illustration, it is to be understood that the present invention is not limited to those precise embodiments, and that various other changes and modifications may be affected herein by one skilled in the art without departing from the scope of the invention.

We claim:

1. A package structure, comprising:
   an antenna package comprising a first antenna, a first antenna feed line, a ground plane, a second antenna, and a second antenna feed line; and
   an RFIC (radio frequency integrated circuit) chip mounted to the antenna package;
   wherein the first antenna is connected to the RFIC chip by the first antenna feed line and the second antenna is connected to the RFIC chip by the second antenna feed line;
   wherein the first antenna is configured to provide broadside radiation in a direction perpendicular to the antenna package, and the second antenna is configured to provide end-fire radiation in a direction parallel to the antenna package;
   wherein the first antenna is disposed on a first surface of the antenna package;
   wherein the second antenna is disposed on second surface of the antenna package;
   wherein the first and second surfaces are different surfaces disposed on opposing sides of the antenna package;
   wherein the RFIC chip is mounted to the second surface of the antenna package;
   wherein the ground plane is disposed within the antenna package between the first and second surfaces of the antenna package;
   wherein the first antenna feed line extends from the second surface of the antenna package through at least a portion of the antenna package to feed the first antenna disposed on the first surface of the antenna package; and
   wherein the second antenna feed line extends along the second surface of the antenna package to feed the second antenna disposed on the second surface of the antenna package.

2. The package structure of claim 1, wherein the first antenna comprises a planar patch antenna.

3. The package structure of claim 1, wherein the first antenna feed line extends through the antenna package from the first surface to the second surface of the antenna package and is physically connected to the first antenna disposed on the first surface of the antenna package.

4. The package structure of claim 1, wherein the first antenna comprises a first radiating element to receive broadside radiation and a second radiating element to transmit broadside radiation.

5. The package structure of claim 1, wherein the second antenna comprises a first radiating element to receive end-fire radiation and a second radiating element to transmit end-fire radiation.

6. The package structure of claim 1, wherein at least one of the first antenna and the second antenna comprises a phased array antenna.

7. An antenna package, comprising:
   a first substrate comprising a first surface and a second surface;
   a second substrate comprising a first surface and a second surface, wherein the first surface of the second substrate is directly bonded to the second surface of the first substrate by an adhesive material layer; and
   an antenna ground plane disposed between the first and second substrates, wherein the antenna ground plane is formed on one of the first surface of the second substrate and the second surface of the first substrate;
   wherein the first substrate comprises a first antenna formed on the first surface of the first substrate;
   wherein the second substrate comprises a second antenna formed on the second surface of the second substrate;
   wherein the first antenna is configured to provide broadside radiation in a direction perpendicular to the antenna package;
   wherein the second antenna is configured to provide end-fife radiation in a direction parallel to the antenna package;
   a first antenna feed line that extends from the second surface of the second substrate through at least the second substrate to feed the first antenna formed on the first surface of the first substrate; and
   a second antenna feed line that extends along the second surface of the second substrate to feed the second antenna disposed on the second surface of the second substrate.

8. The antenna package of claim 7, wherein the first and second substrates are printed circuit boards.

9. The antenna package of claim 7, wherein first antenna comprises a planar patch radiating element.

10. The antenna package of claim 7, wherein the first antenna comprises a cavity filled antenna.

11. The antenna package of claim 7, wherein second antenna comprises a planar Yagi antenna.

12. The antenna package of claim 7, wherein the antenna ground plane is formed on the first surface of the second substrate, and wherein the second antenna comprises a tapered slot antenna patterned in the antenna ground plane.

13. The antenna package of claim 7, wherein the second antenna comprises a planar dipole antenna.

14. The antenna package of claim 7, wherein the second antenna comprises a planar Vivaldi antenna.

15. The antenna package of claim 7, wherein the first antenna comprises a first radiating element to receive broadside radiation and a second radiating element to transmit broadside radiation, and wherein the second antenna comprises a first radiating element to receive end-fire radiation and a second radiating element to transmit end-fire radiation.

16. The antenna package of claim 7, wherein at least one of the first antenna and the second antenna comprises a phased array antenna.

17. A wireless communications device, comprising
   an antenna package comprising a first antenna, a first antenna feed line, a ground plane, a second antenna, and a second antenna feed line;
   an RFIC (radio frequency integrated circuit) chip mounted to the antenna package;
   wherein the first antenna is connected to the RFIC chip by the first antenna feed line and the second antenna is connected to the RFIC chip by the second antenna feed line;
   wherein the first antenna is configured to provide broadside radiation in a direction perpendicular to the antenna package, and the second antenna is configured to provide end-fire radiation in a direction parallel to the antenna package;
   wherein the first antenna is disposed on a first surface of the antenna package;
   wherein the second antenna is disposed on second surface of the antenna package;
   wherein the first and second surfaces are different surfaces disposed on opposing sides of the antenna package;
   wherein the RFIC chip is mounted to the second surface of the antenna package;
   wherein the ground plane is disposed within the antenna package between the first and second surfaces of the antenna package;

wherein the first antenna feed line extends from the second surface of the antenna package through at least a portion of the antenna package to feed the first antenna disposed on the first surface of the antenna package; and wherein the second antenna feed line extends along the second surface of the antenna package to feed the second antenna disposed on the second surface of the antenna package; and an application board, wherein at least a portion of the second surface of the antenna package is mounted to the application board such that a portion of the antenna package having the second antenna is disposed at a distance past an edge of the application board.

18. The wireless communications device of claim 17, wherein the first antenna comprises a planar patch antenna.

19. The wireless communications device of claim 17, wherein the first antenna comprises a first radiating element to receive broadside radiation and a second radiating element to transmit broadside radiation.

20. The wireless communications device of claim 17, wherein the second antenna comprises a first radiating element to receive end-fire radiation and a second radiating element to transmit end-fire radiation.

* * * * *